US008601254B1

(12) United States Patent
Kutz et al.

(10) Patent No.: US 8,601,254 B1
(45) Date of Patent: Dec. 3, 2013

(54) CONFIGURABLE RESET PIN FOR INPUT/OUTPUT PORT

(75) Inventors: Harold Kutz, Edmonds, WA (US);
Timothy Williams, Bellevue, WA (US);
Bert Sullam, Bellevue, WA (US);
Robert W. Metzler, Kirkland, WA (US);
Craig Nemecek, Seattle, WA (US); Eric Blom, Lynwood, WA (US); Melany Richmond, Ellensburg, WA (US);
Warren Snyder, Snohomish, WA (US);
David G. Wright, San Diego, CA (US);
Jeffrey Erickson, Lynnwood, WA (US);
Greg Verge, Lynwood, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 499 days.

(21) Appl. No.: 12/759,426

(22) Filed: Apr. 13, 2010

Related U.S. Application Data

(60) Provisional application No. 61/174,558, filed on May 1, 2009, provisional application No. 61/174,458, filed on Apr. 30, 2009.

(51) Int. Cl.
*G06F 1/24* (2006.01)
*H03K 19/173* (2006.01)

(52) U.S. Cl.
USPC .................................. 713/100; 326/38; 713/1

(58) Field of Classification Search
USPC .......................................... 713/100, 1; 326/38
See application file for complete search history.

(56) References Cited

U.S. PATENT DOCUMENTS

| 5,686,844 | A  | * | 11/1997 | Hull et al. ........................ 326/38 |
| 6,057,705 | A  | * | 5/2000  | Wojewoda et al. .............. 326/38 |
| 6,577,157 | B1 | * | 6/2003  | Cheung et al. ................... 326/38 |
| 6,803,785 | B1 | * | 10/2004 | May et al. ........................ 326/39 |
| 7,046,035 | B2 | * | 5/2006  | Piasecki et al. .................. 326/41 |
| 7,285,980 | B2 | * | 10/2007 | Bansal et al. .................... 326/38 |
| 7,652,500 | B1 | * | 1/2010  | Tang et al. ....................... 326/38 |
| 7,660,968 | B2 | * | 2/2010  | Alfano et al. .................... 712/38 |
| 8,217,700 | B1 | * | 7/2012  | Williams et al. .............. 327/333 |

* cited by examiner

*Primary Examiner* — Chun Cao (57) ABSTRACT

A programmable system includes an input/output (I/O) pin that is configurable into multiple operational states. The programmable system further includes a memory device to store configuration data that, when provided to the I/O pin, causes the I/O pin to reconfigure into one of the operational states. When power is supplied to the system, the memory device is configured to provide the configuration data to the I/O pin prior to a system microcontroller becoming operational responsive to the power.

20 Claims, 6 Drawing Sheets

CONFIGURABLE RESET PIN FOR INPUT/OUTPUT PORT

RELATED APPLICATION

This patent application claims benefit of and priority to U.S. Provisional Patent Application No. 61/174,558, filed May 1, 2009, and U.S. Provisional Patent Application No. 61/174,458, filed Apr. 30, 2009, both of which are incorporated by reference herein.

TECHNICAL FIELD

This disclosure relates generally to electronic circuits, and, more particularly, to configuration of a programmable input/output ports.

BACKGROUND

Most electronic systems include input/output (I/O) pins that can exchange data with external devices. Some of these electronic systems can include fixed-functionality I/O pins, such as a dedicated reset pin or I/O pins that are preset to a particular drive state, while other electronic systems can have I/O pins that are programmable to one of several states, such as an input drive state, an output drive state, or a high impedance state.

Programmable I/O pins are often configured into one of the available states by a microcontroller of the electronic system, possibly in conjunction with firmware. For example, upon system initiation or after a reset, the microcontroller and corresponding firmware can configure the programmable I/O pins to a particular drive state as soon as power has sufficiently ramped up and the electronic system has become fully operational. Prior to the electronic system becoming fully operational, i.e., before the programmable I/O pins can be configured by the microcontroller, many electronic systems will hardwire their programmable I/O pins to a default state, such as the high impedance state.

SUMMARY

This patent application discloses a programmable system having an input/output (I/O) pin that may be configurable into multiple operational states. The programmable system further includes a memory device to store configuration data that, when provided to the I/O pin, causes the I/O pin to reconfigure into one of the operational states. When power is supplied to the system, the memory device may be configured to provide the configuration data to the I/O pin prior to a system microcontroller becoming operational responsive to the power.

In some embodiments, a method includes receiving power with a system having an input/output (I/O) pin that may be configurable into multiple operational states. The method further includes automatically providing stored configuration data from a memory device to the I/O pin responsive to the power prior to a system microcontroller becoming operational responsive to the power, and configuring the I/O pin into one of the operational states according to the configuration data.

In some embodiments, a device includes a programmable input/output (I/O) device that may be configurable into multiple drive states. The device also includes a reset register to provide a default reset value to the programmable I/O device. The programmable I/O device, based on the reset value, may be configured to implement an external reset pin or implement one of the multiple drive states.

DETAILED DESCRIPTION

A Programmable System-on-Chip (PSoC™), such as that used in the PSoC™ family of products offered by Cypress Semiconductor Corporation (San Jose, Calif.), or other electronic system can include a core processing device and programmable analog and digital components that can work in conjunction to perform various data operations. The programmable system includes one or more programmable input/output (I/O) pins to exchange data and/or signaling with external devices, and are configurable into multiple programmable drive states. When power is supplied to the system, a memory device may be configured to provide programmable drive state information to the programmable I/O pin prior to the core processing device becoming operational. Embodiments are shown and described below in greater detail.

Figure 1:
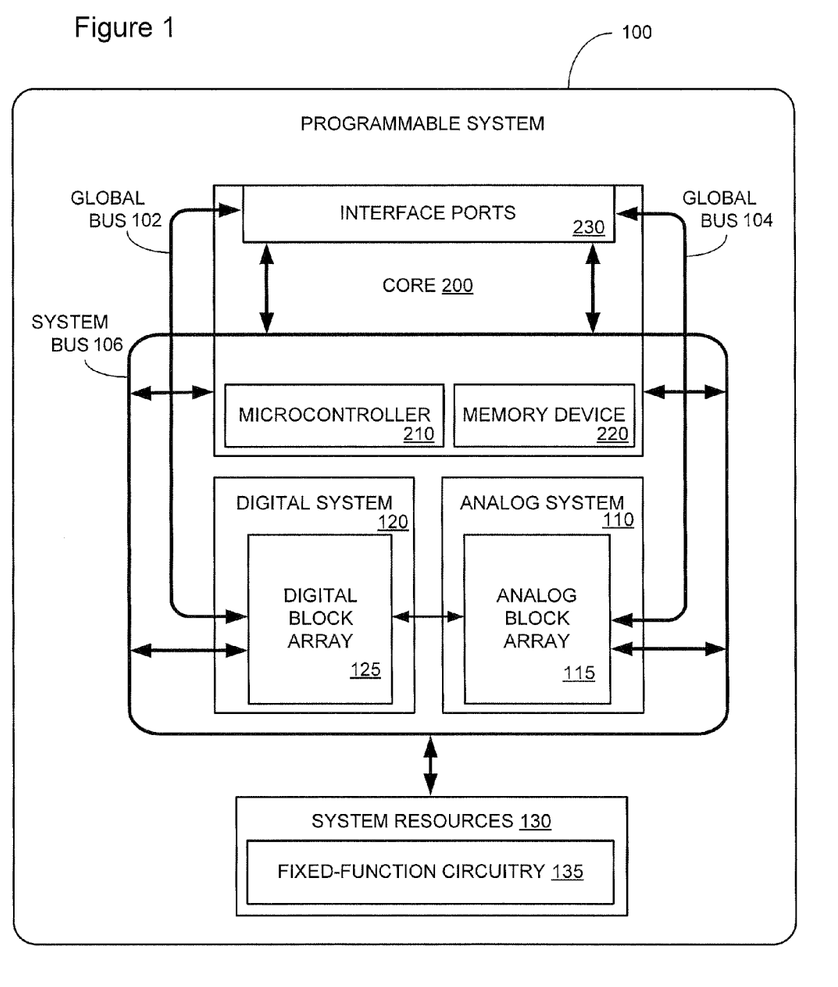
FIG. 1 is block diagram example of a programmable system on a chip (PSoC) according to embodiments of the invention.

FIG. 1 is a block diagram of an example programmable system 100, such as the Programmable System-on-Chip (PSoC™) by Cypress Semiconductor Corporation (San Jose, Calif.) according to embodiments of the invention. Referring to FIG. 1, the programmable system 100 includes a core 200 having a microcontroller 210, a memory device 220, and interface ports 230. The microcontroller 210 can control operations performed by other blocks of the programmable system 100, such as an analog system 110, a digital system 120, or other system resources 130 via global buses 102 and 104 or the system bus 106. Although not shown in FIG. 1, the core 200 can also include other elements, such as an interrupt controller (not shown), a Direct Memory Access (DMA) controller (not shown) or additional memory devices and/or systems (not shown), such as a main memory, for use by the programmable system 100. The additional memory devices and/or systems can be a single memory device or multiple memory devices, and, for example, can comprise Flash memory, random access memory RAM, read-only memory (ROM), or combinations thereof. In some embodiments, the memory device 220 can be separate from the additional memory devices and/or systems, or at least partially included within the additional memory devices and/or systems.

The interface ports 230 can include multiple programmable input/output (I/O) pins that can be configured into multiple programmable drive states, such as an input drive state, an output drive state, or a high-impendence state. The core 200 can configure each of the programmable input/output pins into one of these programmable drive states with the microcontroller 210 or directly from the memory device 220 that stores default programmable drive state information.

For instance, when there is a system initiation or reset, the memory device 220 can become operational before the microcontroller 210, and thus provide the default programmable drive state information directly to the interface ports 230 and configure the programmable input/output (I/O) pins. Once the microcontroller 210 becomes operational, i.e., power has ramped up and become stable, the microcontroller 210, for example, through firmware, can reconfigure the programmable input/output (I/O) pins to a different programmable state. The microcontroller 210 can also program the memory device 220 with new default programmable drive state information that can be utilized when another system power-up or reset event occurs. Embodiments of the core 200 and the configuration of the interface ports 230 will be described below in greater detail.

The digital system 120 includes a digital block array 125 having a plurality of programmable digital circuits (not shown) that can be utilized individually or be variously combined to implement larger applications. In some embodiments, the digital block array 125 can receive configuration commands and data from the microcontroller 210. The digital system 120 can configure the programmable digital circuits according to the commands and implement applications, such as a timer, a counter, a pulse width modulator, a universal asynchronous receiver transmitter (UART), a cyclical redundancy checker (CRC) or generator, among others.

The analog system 110 includes an analog block array 115 having a plurality of reconfigurable analog circuits (not shown) that can be utilized individually or be variously combined to implement larger applications. In some embodiments, the analog block array 115 can receive configuration commands and data from the microcontroller 210. The analog system 110 can configure the reconfigurable analog circuits according to the commands and implement continuous-time applications and/or discrete-time applications, such as analog-to-digital converters (ADC), digital-to-analog converters (DAC), trans-impendence amplifiers, mixers, integrators, variable-pole band-pass, low-pass, and notch filters, selectable gain amplifiers, among others. These and other applications can be used to process data signals and/or packets received over the interface ports 230.

The additional system resources 130 can include fixed-function circuitry 135, which can be utilized alone or in combination with the analog and digital systems 110 and 120 to implement various applications that can be used to process data signals. The fixed-function circuitry 135 can be any digital or analog functional element that is preconfigured in programmable system 100, for example, digital clocks, digital clock dividers, multiply-accumulation circuits, decimators, internal voltage references, integrated switch mode pumps (SMP), among others.

Figure 2:
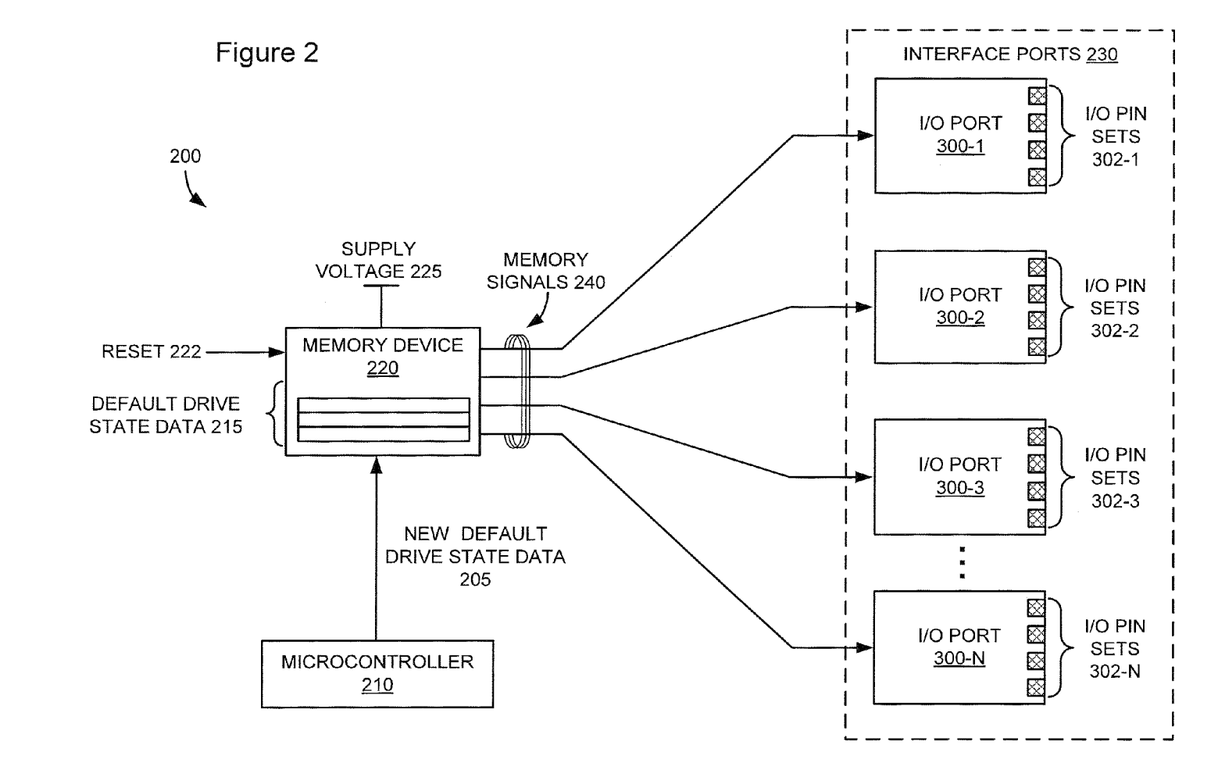
FIG. 2 is a block diagram example of the PSoC core shown in FIG. 1.

FIG. 2 is a block diagram example of the core 200 shown in FIG. 1. Referring to FIG. 2, as discussed above, the core 200 includes the microcontroller 210, the memory device 220, and the interface ports 230. As discussed above, the core 200 can include additional elements or components, such as a main microcontroller memory, which can include the memory device 220 or be separate from the memory device 220.

The interface ports 230 include multiple input/output (I/O) ports 300-1 to 300-N each having a set of I/O pins 302-1 to 302-N, respectively. In some embodiments, an I/O pin set 302 can include I/O pins that have a same or similar arrangement or structure, while, in other embodiments, the I/O pin set 302 can include configurable drive state I/O pins having differing structures or arrangements, and/or implement various functionality.

The sets of I/O pins 302-1 to 302-N can each be configured into a programmable drive state, and exchange signals with one or more external devices. In some embodiments, the resolution of the configuration may be on a per-port-basis, i.e. all pins in an I/O port 300 are configured the same. The resolution, however, can also be on a per-pin-basis, i.e., each I/O pin receives an individual configuration.

The core 200 can configure the sets of I/O pins 302-1 to 302-N in different ways. For instance, when the microcontroller 210 is operational, the microcontroller 210 can write a programmable drive state to the I/O ports 300-1 to 300-N or directly to the sets of I/O pins 302-1 to 302-N. When the microcontroller 210 is not operational, such as during system initiation or after a system reset, the memory device 220 can configure the sets of I/O pins 302-1 to 302-N.

The memory device 220 can store default drive state data 215 that, when provided to the I/O ports 300-1 to 300-N through memory signals 240, causes the I/O pin sets 302-1 to 302-N to be configured into a drive state. In some embodiments, the memory signals 240 can provide the default drive state data 215 to the I/O ports 300-1 to 300-N in parallel, allowing for an atomic configuration of the I/O pins in the interface ports 230. The memory signals 240 can also serially provide the default drive state data 215 to the I/O ports 300-1 to 300-N. In some embodiments, the memory device 220 can be a non-volatile memory having one or more latches, i.e., capable of retaining stored information during periods without power.

In some embodiments, the memory device 220 may be configured to provide the default drive state data 215 in response to a reset signal 222. The reset signal 222 can indicate that the programmable system 100 has been reset, either internally or externally through an external reset pin, or that the PSoC has recently been initiated or powered-on. The reset signal 222 can indicate when the programmable system 100 has exited a reset state and the other system components have been powered-up and are currently operational. Although not shown in FIG. 2, the memory device may also be configured to provide the default drive state data 215 in response to a low voltage detect signal.

After a system initiation event or a system reset indicated by the reset signal 222, the memory device 220 can provide the default drive state data 215 to the I/O ports 300-1 to 300-N through the memory signals 240. The memory device 220 also receives a supply voltage 225 that, after a short delay, can render the memory device 220 operational, allowing the memory device 220 to provide the default drive state data 215 to the I/O ports 300-1 to 300-N as prompted by the reset signal. The microcontroller 210 can also receive the supply voltage 225, but does not become operational as quickly as the memory device 220. Thus, the memory device 220 can configure the I/O ports 300-1 to 300-N and associated I/O pins prior to the microcontroller 210 becoming operational.

The memory device 220 can become operational more quickly than the microcontroller 210 in several ways. For instance, the memory device 220 can have a lower operational voltage threshold than the microcontroller 210. Thus, when the supply voltage 225 ramps up over time, the memory device 220 may be able to become operational before the microcontroller 210 due to the difference in their operational voltage levels. The microcontroller 210 further has a start-up or initiation delay after it receives a supply voltage 225 having a voltage level over the operational voltage threshold for the microcontroller 210. Thus, when the microcontroller 210 and the memory device 220 receive a supply voltage 225 over their operational voltage thresholds, respectively, around the same time, the memory device 220 can provide default drive state data 215 to the I/O ports 300-1 to 300-N prior to the microcontroller 210.

In some embodiments, the memory device 220 and the microcontroller 210 can receive different supply voltages. For example, the programmable system 100 can be configured to receive multiple different external supply voltages, and regulate one or more internal supply voltages. The programmable system 100 can be configured to provide the memory device 220, and optionally the I/O ports 300-1 to 300-N, with at least one of the supply voltages, such as supply voltage 225, while providing the microcontroller 210 with a different supply voltage (not shown).

After the microcontroller 210 becomes operational, the microcontroller 210 can reconfigure the I/O ports 300-1 to 300-N according to different programmable drive states. The microcontroller 210 can also reprogram the memory device 220, for example, by providing the memory device 220 with new default drive state data 205. The memory device 220 can utilize this new default drive state data 205 the next time there is a system initiation or a system reset.

Figure 3:
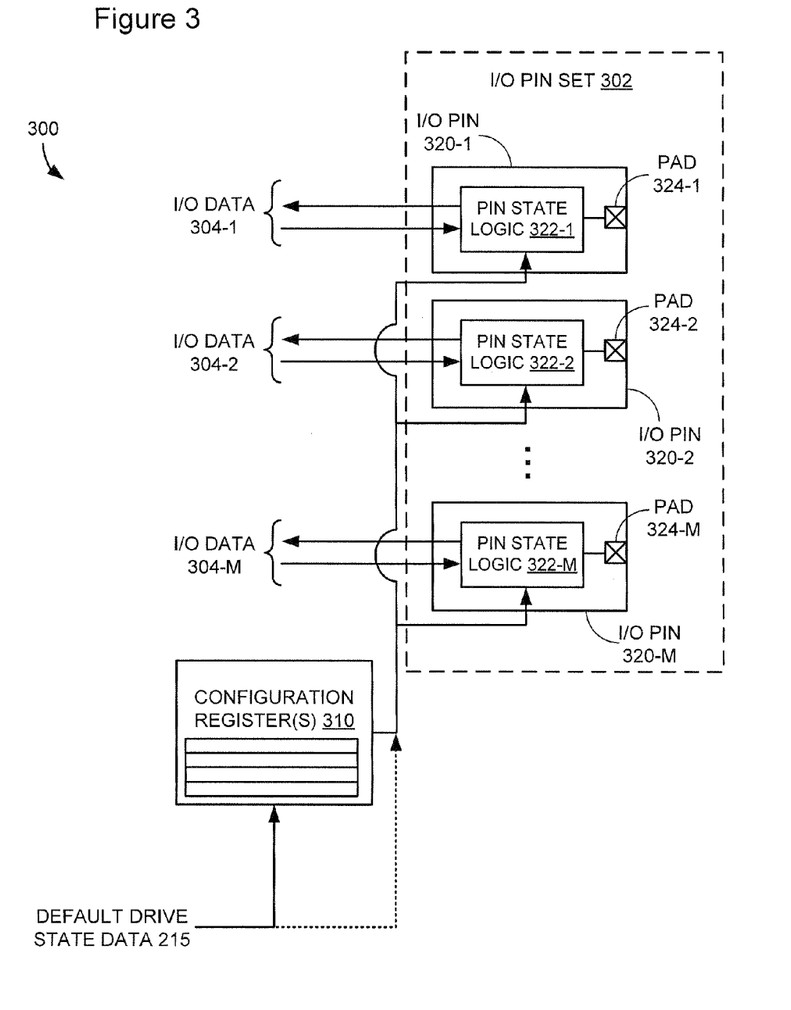
FIG. 3 is a block diagram example of the I/O port shown in FIG. 2.

FIG. 3 is a block diagram example of the I/O port 300 shown in FIG. 2. Referring to FIG. 3, the I/O port 300 includes an I/O pin set 302 having multiple input/output (I/O) pins 320-1 to 320-M available to exchange I/O data 304-1 to 304-M with one or more external devices. Each I/O pin 320-1 to 320-M includes an I/O pad 324 and pin state logic or circuitry 322. The I/O pad 324 can receive input signals from external devices or send output signals to the external devices depending on the configuration of the pin state logic 322.

The pin state logic 322 can be reconfigured to implement multiple different drive states, such as an input drive state, an output drive state, a resistive state, or a high impendence state. In some embodiments, as will be described below in FIG. 4 in greater detail, the pin state logic 322 can also configure the I/O pin to be an external reset input pin. The pin state logic 322 can receive default drive state data 215 from a configuration register(s) 310 or directly from the memory device 220. The pin state logic 322 may be reconfigured into one of the available drive states based on the default drive state data 215. Although not shown in FIG. 3, the pin state logic 322 can also be configured by the microcontroller 210. For example, the microcontroller 210 can write programmable drive state data to configuration register(s) 310 or directly to the I/O pins 320-1 to 320-M.

Figure 4:
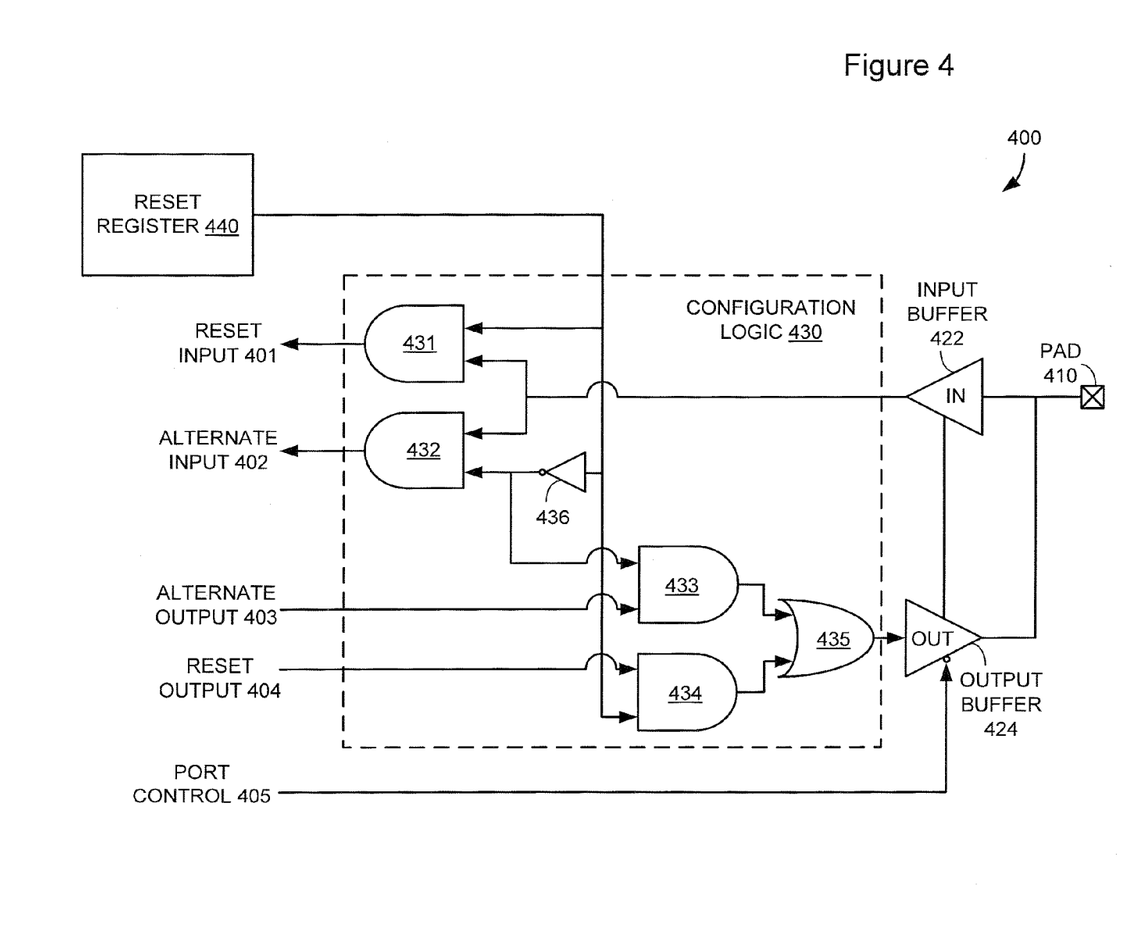
FIG. 4 is a block diagram example of a multifunction reset pin according to embodiments of the invention.

FIG. 4 is a block diagram example of a multifunction reset pin 400 according to embodiments of the invention. Referring to FIG. 4, the multifunction reset pin 400 includes configuration logic or circuitry 430 that can allow the multifunction reset pin 400 to implement an external reset pin or an alternate function. The multifunction reset pin 400 also includes a reset register 440 to store a reset value that, when provided to the configuration logic 430, causes the configuration logic 430 to implement either the external reset pin or alternate function.

The multifunction reset pin 400 includes a pad 410 to exchange signals with one or more external devices. The pad 410 may be coupled to two buffers, an input buffer 422 and an output buffer 424. These buffers 422 and 424 can be configured to have a particular drive state, such as an input drive state, an output drive state, or a high-impedance state. The buffers 422 and 424 can receive a port control signal 405, which can direct the buffers 422 and 424 into a drive state. In some embodiments, the port control signal 405 can be the default drive state data from the memory device 220 or other drive state data from the microcontroller 210.

The configuration logic 430 includes two main paths, an input path from the input buffer 422 and an output path to the output buffer 424. The input path includes a reset AND gate 431, which receives I/O data from the input buffer 422 and the reset value from the reset register 440. When the reset value is activated, the reset AND gate 431 can pass the I/O data as a reset input signal 401 to the core 200.

The input path includes an alternative function AND gate 432, which receives I/O data from the input buffer 422 and an inverted reset value via an inverter 436. When the inverted reset value is activated, the alternative function AND gate 432 can pass the I/O data as an alternative input signal 402 to the core 200. In other words, the reset value from the register 440 can dictate whether the I/O data from the input buffer 422 may be provided to the core 200 as an external reset signal or provided as received input data.

The output path includes an alternative function AND gate 433, which receives alternative data 403 from the core 200 and the inverted reset value via the inverter 436. When the inverted reset value is activated, the alternative function AND gate 433 can output the alternative data 403.

The output path also includes a reset AND gate 434, which receives reset signal 404 from the core 200 and the reset value from the reset register 440. When the reset value is activated, the reset AND gate 434 can output the reset signal 404. The output path further includes an OR gate 435 to receive the both outputs of the AND gates 433 and 434, and provide and output to the output buffer 424. The reset value from the register 440 can dictate whether the alternative data 403 or the reset signal 404 may be provided to the output buffer 424 and eventually output from the multifunction reset pin 400 via the pad 410.

When the reset value is activated, the configuration logic 430 can pass external reset signals through reset AND gate 431 to the core 200, and pass internal resets through the reset AND gate 434 to the pad 410 for output to one or more external devices. When the reset value is deactivated, the configuration logic 430 can pass I/O data through AND gate 432 to the core 200, and I/O data from the core 200 through the AND gate 433 to the pad 410 for output to one or more external devices.

Although FIG. 4 shows the configuration logic 430 includes and input path and an output path, in some embodiments, the configuration logic 430 can have an input path that does not include a reset-input option and/or the configuration logic 430 can have an output path that does not include a reset-output option.

Figure 5:
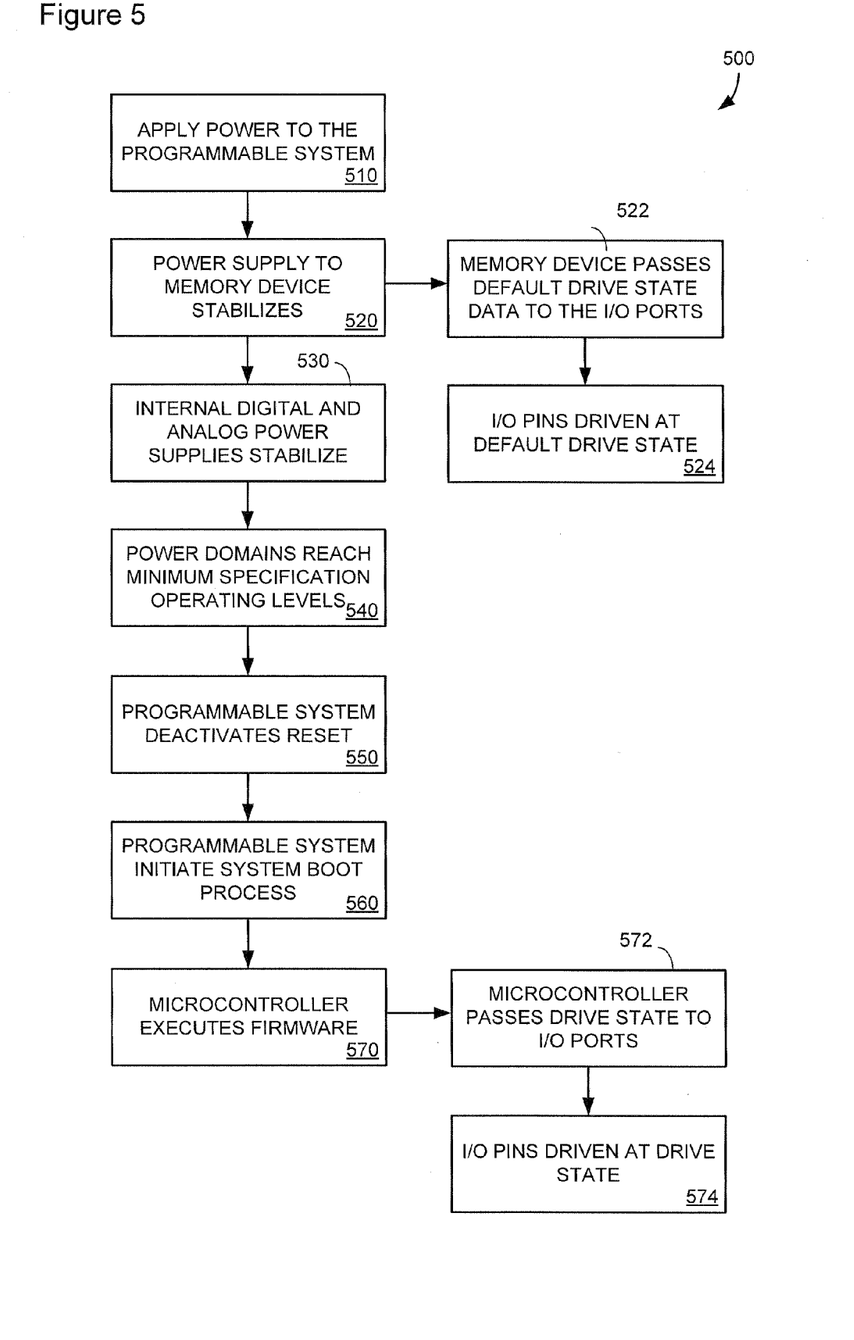
FIG. 5 is an example timeline flowchart for programming of the I/O ports shown in FIGS. 3 and 4.

FIG. 5 is an example timeline flowchart 500 for programming of the I/O ports 300 shown in FIGS. 3 and 4. In a first block 510, power is applied to the programmable system 100 from one or more external or internal supply voltages. The power can be applied upon system initiation or after a reset event has been triggered. In some embodiments, the I/O ports 300-1 to 300-N and/or the memory device 220 can receive a supply voltage, while other portions of the programmable system 100 can receive one or more different supply voltages.

In a block 520, the power to the memory device 220 stabilizes, thus allowing the memory device 220 to become operational. Since the minimum stable power level that allows the memory device 220 to become operational may be lower than the microcontroller 210 and other system components, the memory device 220 becomes operational before the microcontroller 210 and the other system components.

In a block 522, the memory device 220 passes default drive state data 215 to the I/O ports 300, and in a block 524, the I/O pins 320 are driven at the default drive state corresponding to the default drive state data 215. The operations performed in blocks 522 and 524 are performed before the microcontroller 210 and the other system components become operational.

In a block 530, internal digital and analog power supplies stabilize, and in block 540, power domains reach minimum specification operating levels. In a block 550, the programmable system 100 deactivates a reset signal 222. The memory device 220 will have provided the default drive state data 215 to the I/O ports 300 prior to the reset signal 222 being deactivated.

In a block 560, the programmable system 100 initiates a system boot process, and in block 570, the microcontroller 210 begins to execute firmware. In some embodiments, for example, when the programmable system 100 receives multiple supply voltages, the microcontroller 210 can have a stabilized power before the power to the memory device 220 stabilizes in block 520. Since the programmable system 100 can remain in a reset state, e.g., with an activated reset signal 222, until all of the power supplies or supply voltages are stabilized, the memory device 220 is configured to transmit the default drive state data 215 and configure the I/O ports 300 during the execution of blocks 560 and 570.

After the microcontroller 210 begins to execute firmware, in a block 572, the I/O ports 300 can receive a different drive state configuration from the microcontroller 210. In a block 574, the I/O pins 320 are driven at the drive state based on the configuration from the microcontroller 210. Thus, with the addition of the memory device 220 to the core 200, the I/O ports 300 and corresponding I/O pins 320 can be configured into a user programmable drive state before the microcontroller 210 and firmware become operational.

Figure 6:
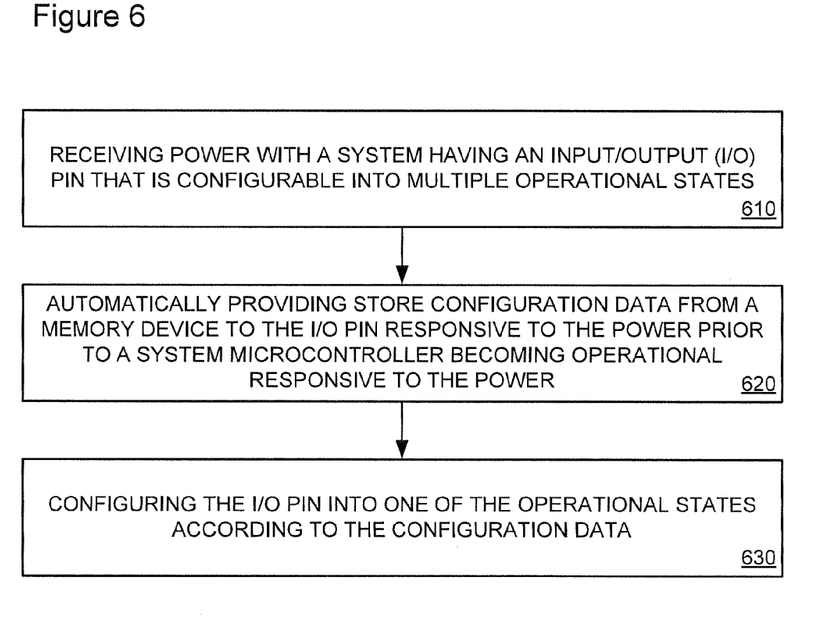
FIG. 6 is an example operational flowchart of the programmable system on a chip according to embodiments of the invention.

FIG. 6 is an example operational flowchart of the programmable system on a chip according to embodiments of the invention. Referring to FIG. 6, in a block 610, the programmable system 100 is configured to receive power. The programmable system 100 includes I/O pins 320 that are configurable into multiple user-programmable drive states, such as an input drive state, an output drive state, a high-impedance state, or an external reset state.

In a block 620, a memory device 220 can be configured to automatically provide default drive state data 215 to the I/O pin 320 responsive to the power. In some embodiments, once the memory device 215 becomes operational responsive to the supplied power, the memory device 215 can automatically provide default drive state data 215 to the I/O pin 320. As discussed above, the memory device 220 can provide the default drive state data to the I/O pins 320 prior to the microcontroller 210 becoming operational responsive to the power. In a block 630, the I/O pin can be configured into one of the operational states according to the configuration data.

One of skill in the art will recognize that the concepts taught herein can be tailored to a particular application in many other ways. In particular, those skilled in the art will recognize that the illustrated embodiments are but one of many alternative implementations that will become apparent upon reading this disclosure.

The preceding embodiments are examples. Although the specification may refer to "an", "one", "another", or "some" embodiment(s) in several locations, this does not necessarily mean that each such reference is to the same embodiment(s), or that the feature only applies to a single embodiment.

The invention claimed is:

1. A system comprising:
a programmable input/output (I/O) pin configurable into multiple operational states; and
a memory device to store configuration data that, when provided to the programmable I/O pin, causes the programmable I/O pin to reconfigure into one of the operational states, the programmable I/O pin including configuration reset circuitry configured to change a configuration of the programmable I/O pin between an external data I/O pin and an external reset pin in response to the configuration data, wherein the external data I/O pin is configured to pass I/O data between an external pad and internal circuitry and the external reset pin is configured generate a reset signal to reset the internal circuitry in response to an external input received on the external pad,
wherein the system is further configured to:
detect a first power level;
use the configuration data in the memory device to configure drive states for multiple programmable I/O pins including the programmable I/O pin and additional programmable I/O pins in response to detecting the first power level;
detect a second power level; and
initiate a system boot process in response to detecting the second power level, wherein the system boot process executes firmware that reconfigures the drive states for at least some of the multiple programmable I/O pins.

2. The system of claim 1,
wherein the configuration reset circuitry further comprises:
a first input configured to output the reset signal to the internal circuitry based on the external input from the external pad, a reset register value, and a port control signal;
a second input configured to pass the I/O data from the external pad to the internal circuitry based on the reset register value and the port control signal;
a first output configured to pass an output reset signal from the internal circuitry to the external pad based on the reset register value and the port control signal; and
a second output configured to pass the I/O data from the internal circuitry to the external pad based on the reset register value and the port control signal.

3. The system of claim 1, wherein, in response to a system reset, the memory device is configured to provide the configuration data to the programmable I/O pin prior to a system controller becoming operational responsive to the system reset.

4. The system of claim 1, further comprising an I/O port including the multiple programmable I/O pins, wherein the memory device is configured to provide the configuration data to the I/O port prior to a system controller becoming operational responsive to the power.

5. The system of claim 4, wherein the multiple programmable I/O pins are configured in a same operational state responsive to the configuration data provided to the I/O port.

6. The system of claim 4, wherein the I/O port includes at least one register to store the configuration data from the memory device, and wherein each of the multiple programmable I/O pins in the I/O port includes configuration circuitry to set the multiple programmable I/O pins in the operational states indicated by the configuration data.

7. The system of claim 1, wherein, in response to power being supplied to the system, the memory device is configured to provide the configuration data to the programmable I/O pin prior to a system controller becoming operational responsive to the power.

8. The system of claim 7, wherein the system controller, after powered-up, is configured to direct the programmable I/O pin to reconfigure into one of the operational states, or to reprogram the configuration data in the memory device, wherein the memory device is configured to provide the reprogrammed configuration data to the programmable I/O pin responsive to a future reset or system initiation.

9. A method comprising:
receiving power with a system having a programmable input/output (I/O) pin that is configurable into multiple operational states;
automatically providing configuration data from a memory device to the programmable I/O pin responsive to the power and prior to a processing device becoming operationally responsive to the power; and
switching the operational states of the programmable I/O pin between an external reset pin and an external I/O pin according to the configuration data, wherein the external reset pin is configured to initiate a reset of the system in response to an external input received on an external pad and the external I/O pin is configured to pass I/O data between the system and the external pad;
detecting a first power level;
using the configuration data in the memory device to configure drive states for additional I/O pins in response to detecting the first power level;
detecting a second power level; and
initiating the processing device to perform a system boot process in response to detecting the second power level, wherein the processing device during the system boot process executes firmware that reconfigures the drive states for at least some of the additional I/O pins.

10. The method of claim 9, wherein the external reset pin is further configured to output an external reset signal that is configured to initiate a reset of at least one external device sampling the external reset pin.

11. The method of claim 9, further comprising reconfiguring the programmable I/O pin into a different one of the operational states with the processing device.

12. The method of claim 9, wherein the external reset pin is configured to output the external reset signal to the external pad in response to an internal reset output signal.

13. The method of claim 9, wherein the configuration data is reprogrammable by the processing device after the processing device becomes operational responsive to the power.

14. A device comprising:
a programmable input/output (I/O) device that is configurable into multiple drive states; and
a reset register configured to provide a default reset value to the programmable I/O device, wherein the programmable I/O device, based on the reset value, is configured to switch between operation as an external reset pin configured to enable an external input on an external pad to reset the device and an external I/O pin configured to pass I/O data between the device and an external pad, wherein
the reset register is configured to use the default reset value to configure the multiple drive states for the I/O device in response to detecting a first power level; and
a processing device is configured to perform a system boot process in response to detecting a second power level higher than the first power level and reconfigure the multiple drive states for the programmable I/O device during the system boot process.

15. The device of claim 14, further comprising a memory device configured to store the default reset value, wherein, when the memory device becomes operational after the reset of the device, the memory device is configured to provide the default reset value to the reset register.

16. The device of claim 15, wherein the memory device stores default drive state data that is configured to cause the programmable I/O device to reconfigure into one of the multiple drive states, wherein, when the memory device becomes operational after the reset of the device, the memory device is configured to provide the default drive state data to the programmable I/O device.

17. The device of claim 14, wherein the drive states include one or more of an input drive state, output drive state, or a high-impedance state.

18. The device of claim 14, further comprising a microcontroller to reprogram the default reset value in the reset register, wherein the reset register is configured to provide the reprogrammed reset value to the programmable I/O device.

19. The device of claim 14, wherein the external input is configured to initiate the reset of the device.

20. The device of claim 14, wherein the external reset pin is configured to output an external reset signal that is configured to initiate a reset of at least one external device sampling the external reset pin.

* * * * *